(12) United States Patent
Chi et al.

(10) Patent No.: US 10,157,827 B2
(45) Date of Patent: Dec. 18, 2018

(54) SEMICONDUCTOR CONTACT

(71) Applicants: INTERNATIONAL BUSINESS MACHINES CORPORATION, Armonk, NY (US); GlobalFoundries, Inc., Grand Cayman (KY)

(72) Inventors: Cheng Chi, Jersey City, NY (US); Ruilong Xie, Schenectady, NY (US)

(73) Assignees: INTERNATIONAL BUSINESS MACHINES CORPORATION, Armonk, NY (US); GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/196,371

(22) Filed: Jun. 29, 2016

(65) Prior Publication Data
US 2018/0005901 A1    Jan. 4, 2018

(51) Int. Cl.
*H01L 23/522* (2006.01)
*H01L 29/417* (2006.01)
(Continued)

(52) U.S. Cl.
CPC .. *H01L 23/5226* (2013.01); *H01L 21/823814* (2013.01); *H01L 21/823828* (2013.01); *H01L 21/823871* (2013.01); *H01L 21/823878* (2013.01); *H01L 23/4855* (2013.01); *H01L 23/5283* (2013.01); *H01L 29/41791* (2013.01); *H01L 21/31111* (2013.01);
(Continued)

(58) Field of Classification Search
CPC ........... H01L 23/5283; H01L 21/28562; H01L 21/76849; H01L 29/7833; H01L 23/485; H01L 23/5226; H01L 21/823814; H01L 23/4855; H01L 21/823878; H01L 21/823871; H01L 29/41791; H01L 21/823828

See application file for complete search history.

(56) References Cited

U.S. PATENT DOCUMENTS 6,071,809 A * 6/2000 Zhao .................... H01L 21/7681
                                                              257/E21.579
6,103,616 A * 8/2000 Yu ....................... H01L 21/76811
                                                              257/E21.579

(Continued)

*Primary Examiner* — Yu Chen
*Assistant Examiner* — Vincent Wall
(74) *Attorney, Agent, or Firm* — Cantor Colburn LLP; Vazken Alexanian

(57) ABSTRACT

A method for forming a semiconductor device comprises forming a gate stack on a channel region of a semiconductor, forming a source/drain region adjacent to the channel region, depositing a first insulator layer over the source/drain region, and removing a portion of the first insulator layer to form a first cavity that exposes a portion of the source/drain region. A first conductive material is deposited in the first cavity, and a conductive extension is formed from the first conductive material over the first insulator layer. A protective layer is deposited over the extension and a second insulator layer is deposited over the protective layer. A portion of the second insulator layer is removed to form a second cavity that exposes the protective layer, and an exposed portion of the protective layer is removed to expose a portion of the extension. A second conductive material is deposited in the second cavity.

20 Claims, 25 Drawing Sheets

(51) Int. Cl.
  *H01L 23/528* (2006.01)
  *H01L 23/485* (2006.01)
  H01L 21/8238 (2006.01)
  H01L 21/311 (2006.01)
  H01L 27/12 (2006.01)
  H01L 29/66 (2006.01)

(52) U.S. Cl.
  CPC ... *H01L 21/823821* (2013.01); *H01L 27/1211* (2013.01); *H01L 29/66545* (2013.01)

(56) References Cited

U.S. PATENT DOCUMENTS

| | | | |
|---|---|---|---|
| 8,124,531 B2 | 2/2012 | Chandrashekar et al. | |
| 8,518,774 B2 * | 8/2013 | Fazan | H01L 21/84 |
| | | | 257/E21.646 |
| 8,524,600 B2 | 9/2013 | Lei et al. | |
| 8,551,885 B2 | 10/2013 | Chen et al. | |
| 8,901,627 B2 * | 12/2014 | Wu | H01L 29/66477 |
| | | | 257/288 |
| 2009/0004850 A1 | 1/2009 | Ganguli et al. | |
| 2009/0269507 A1 | 10/2009 | Yu et al. | |
| 2010/0055904 A1 | 3/2010 | Chen et al. | |
| 2013/0307032 A1 * | 11/2013 | Kamineni | H01L 23/485 |
| | | | 257/288 |
| 2014/0264872 A1 | 8/2014 | Lin et al. | |
| 2015/0021672 A1 | 1/2015 | Chuang et al. | |
| 2015/0170961 A1 | 6/2015 | Romero et al. | |
| 2015/0235957 A1 | 8/2015 | Zhang et al. | |

\* cited by examiner

SEMICONDUCTOR CONTACT

BACKGROUND

The present invention generally relates to complimentary metal-oxide semiconductors (CMOS) and metal-oxide-semiconductor field-effect transistors (MOSFET), and more specifically, to contacts for semiconductor devices.

The MOSFET is a transistor used for switching electronic signals. The MOSFET has a source, a drain, and gate electrode. The gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and includes n-doped source and drain junctions. The pFET uses holes as the current carriers and includes p-doped source and drain junctions.

The FinFET is a type of MOSFET. The FinFET is a multiple-gate MOSFET device that mitigates the effects of short channels and reduces drain-induced barrier lowering. The "fin" refers to a semiconductor material patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length may be achieved in a given region of the substrate as opposed to a planar FET device.

Gate spacers form an insulating film along gate sidewalls. Gate spacers may also initially be formed along sacrificial gate sidewalls in replacement gate technology. The gate spacers are used to define source/drain regions in active areas of a semiconductor substrate located adjacent to the gate.

Device scaling in the semiconductor industry reduces costs, decreases power consumption, and provides faster devices with increased functions per unit area. Improvements in optical lithography have played a major role in device scaling. However, optical lithography has limitations for minimum dimensions and pitch, which are determined by the wavelength of the irradiation.

SUMMARY

According to an embodiment of the present invention, a method for forming a semiconductor device comprises forming a gate stack on a channel region of a semiconductor, forming a source/drain region adjacent to the channel region, depositing a first insulator layer over the source/drain region, and removing a portion of the first insulator layer to form a first cavity that exposes a portion of the source/drain region. A first conductive material is deposited in the first cavity, and a conductive extension is formed from the first conductive material over the first insulator layer. A protective layer is deposited over the conductive extension and a second insulator layer is deposited over the protective layer. A portion of the second insulator layer is removed to form a second cavity that exposes the protective layer, and an exposed portion of the protective layer is removed to expose a portion of the conductive extension. A second conductive material is deposited in the second cavity.

According to another embodiment of the present invention, a method for forming a semiconductor device comprises forming a semiconductor fin on a substrate, forming a gate stack over a channel region of the semiconductor fin, forming a source/drain region on the semiconductor fin, and depositing a first insulator layer over the source/drain region. A portion of the first insulator layer is removed to form a first cavity that exposes a portion of the source/drain region, and a first conductive material is deposited in the first cavity. A conductive extension is formed from the first conductive material over the first insulator layer, a protective layer is deposited over the conductive extension, and a second insulator layer is deposited over the protective layer. A portion of the second insulator layer is removed to form a second cavity that exposes the protective layer. An exposed portion of the protective layer is removed to expose a portion of the conductive extension. A second conductive material is deposited in the second cavity.

According to yet another embodiment of the present invention, a semiconductor device comprises a gate stack arranged on a substrate, and a source/drain region arranged adjacent to the gate stack. A first insulator layer is arranged on the source/drain region, and a second insulator layer arranged on the first insulator layer. A conductive contact contacts the source/drain region and passes through the first insulator layer and the second insulator layer, the conductive contact includes an conductive extension portion contacting the second insulator layer. A protective layer is arranged on a portion of the conductive extension portion, the protective layer is arranged between the first insulator layer and the second insulator layer.

BRIEF DESCRIPTION OF THE DRAWINGS

FIGS. 1-16B illustrate a method for forming contacts in a semiconductor device.

FIG. 1 illustrates a side view of a semiconductor-on-insulator (SOI) wafer.

FIG. 4 illustrates a top view following the formation of spacers along sidewalls of the sacrificial gates.

FIG. 5 illustrates a top view following the formation of source/drain regions.

FIG. 7 illustrates a top view following the removal of the sacrificial gates (of FIG. 6B) to form cavities that expose the channel regions of the fins.

FIG. 10 illustrates a cut-away view following the deposition of conductive material in the cavities (of FIG. 9A).

FIG. 11 illustrates a cut-away view following the growth of a second conductive material 1102 on exposed portions of the conductive material.

FIG. 12 illustrates a cut-away view following the deposition of a protective layer over exposed portions of the conductive material.

FIG. 13 illustrates a cut-away view following the deposition of an inter-level dielectric layer over the protective layer.

FIG. 14 illustrates a cut-away view following a lithographic patterning and etching process that removes exposed portions of the inter-level dielectric layer to form cavities.

FIG. 16B illustrates a top view of the third conductive material and the inter-level dielectric layer.

DETAILED DESCRIPTION

Semiconductor devices having source/drain regions and gate stacks are electrically connected using contacts that extend vertically through insulator layers. The contacts are often formed after the semiconductor devices are substantially fabricated by patterning and etching through insulator layers to form cavities. The cavities are filled with a conductive material to form the contacts.

The conductive material used to form the contacts may, in some fabrication processes, become undesirably oxidized, which causes an undesirable increase in the resistance of the contacts. The oxidation of the conductive material may be mitigated by, for example, depositing a layer of nitride material over the conductive material, which substantially reduces oxidation.

However, the use of a nitride layer over contacts, may complicate the patterning and etching process, and may result in undesirable electrical shorts between the source/drain contacts and the gate stack contacts if the pattern used to form the contacts is misaligned.

The methods and resultant structures described herein provide for fabricating contacts that are substantially free from oxidation while reducing the chances of forming shorts between the gate contacts and the source/drain region contacts.

FIGS. 1-16B illustrate a method for forming contacts in a semiconductor device. In the illustrated exemplary embodiment, a finFET device is shown. However, alternate exemplary embodiments may use similar methods to form contacts in other types of devices including, for example, planar FETs, nanowire FETs, or other semiconductor devices that use conductive contacts.

Figure 1:
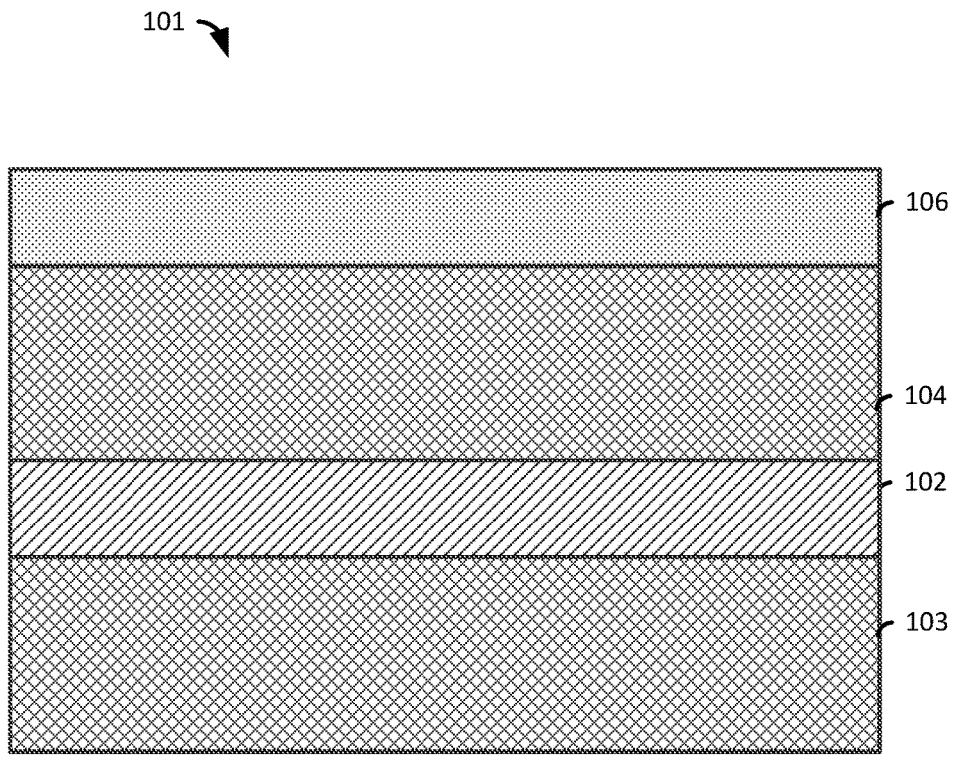

FIG. 1 illustrates a side view of a semiconductor-on-insulator (SOI) wafer 101. The SOI wafer 101 includes an insulator layer 102 on a bulk layer 103, and a semiconductor substrate 104 arranged on the insulator layer 102. The SOI wafer 101 can be formed by any suitable technique such as, for example wafer bonding, Smartcut™, SIMOX (Separation by IMplanted Oxygen).

The semiconductor substrate 104 may include, for example, silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate may also comprise an organic semiconductor or a layered semiconductor such as, for example, Si/SiGe, silicon-on-insulator or a SiGe-on-insulator. A portion or entire semiconductor substrate may be amorphous, polycrystalline, or monocrystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

The insulator layer 102 may include, for example, a buried oxide (BOX) material or other suitable insulator materials. Examples of suitable insulator materials include silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum.

The thickness of insulator layer 102 generally varies and is not intended to be limited. In one aspect, the thickness of the insulator layer 102 is in a range from about 10 nm to about 1000 nm. The insulator layer 102 can be formed by any suitable process such as thermal oxidation, thermal nitridation, chemical vapor deposition (CVD).

A hardmask 106 is arranged on the semiconductor substrate 104. The hardmask 106 may include, for example, silicon oxide, silicon nitride (SiN), SiOCN, SiBCN or any suitable combination of those. The hardmask 106 may be deposited using a deposition process, including, but not limited to, PVD, CVD, PECVD, or any combination thereof.

Figure 2A:
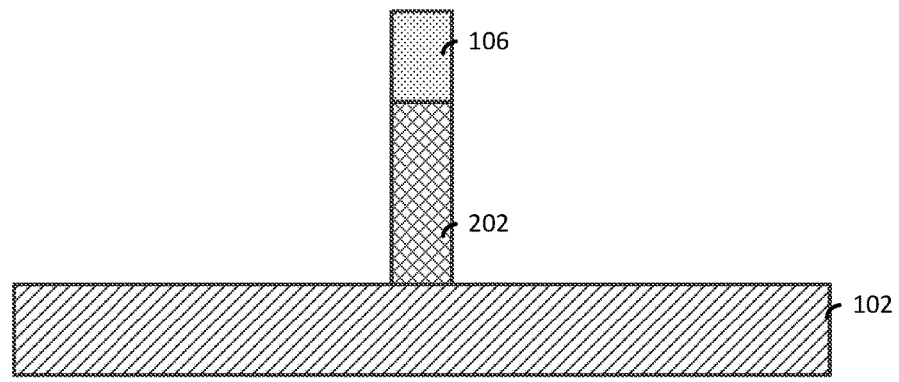
FIG. 2A illustrates a cut-away view along the line A-A (of FIG. 2B) following the formation of fins on the insulator layer.
Figure 2B:
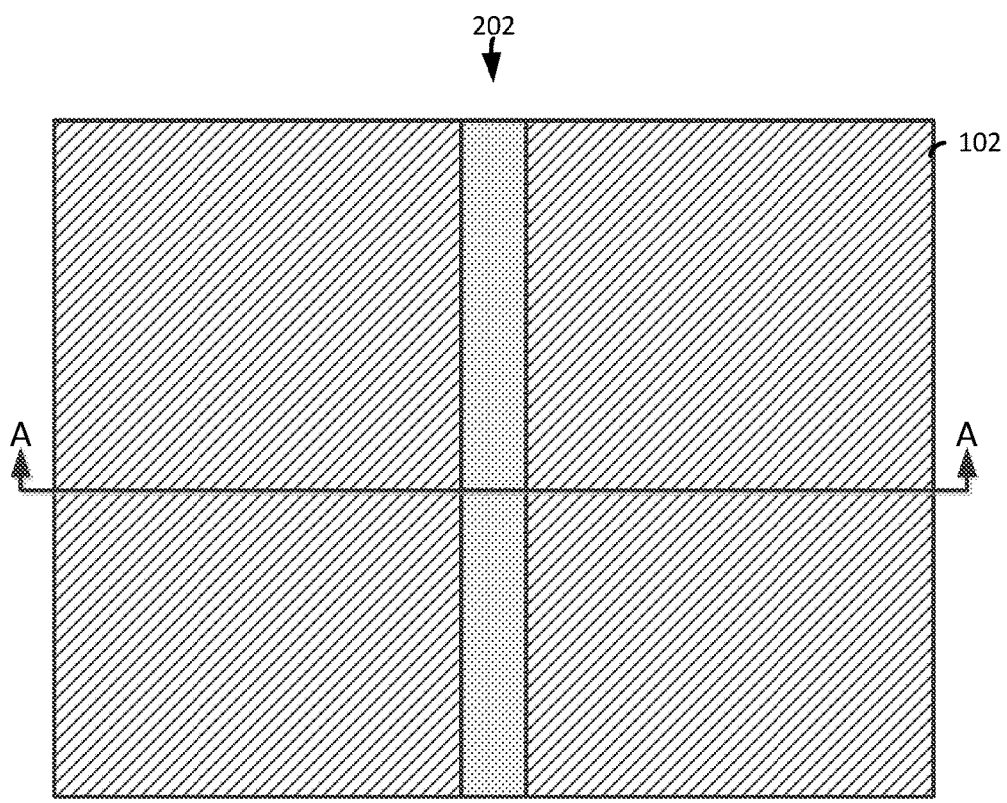
FIG. 2B illustrates a top view of the fin arranged on the semiconductor substrate.

FIG. 2A illustrates a cut-away view along the line A-A (of FIG. 2B) following the formation of fins 202 on the insulator layer 102. The fins 202 may be patterned by, for example, a lithographic patterning and etching process such as, reactive ion etching (ME) or a sidewall imaging transfer process that removes exposed portions of the hardmask 106 and portions of the semiconductor substrate 104 to expose portions of the insulator layer 102. FIG. 2B illustrates a top view of the fin 202 arranged on the semiconductor substrate 104.

Figure 3A:
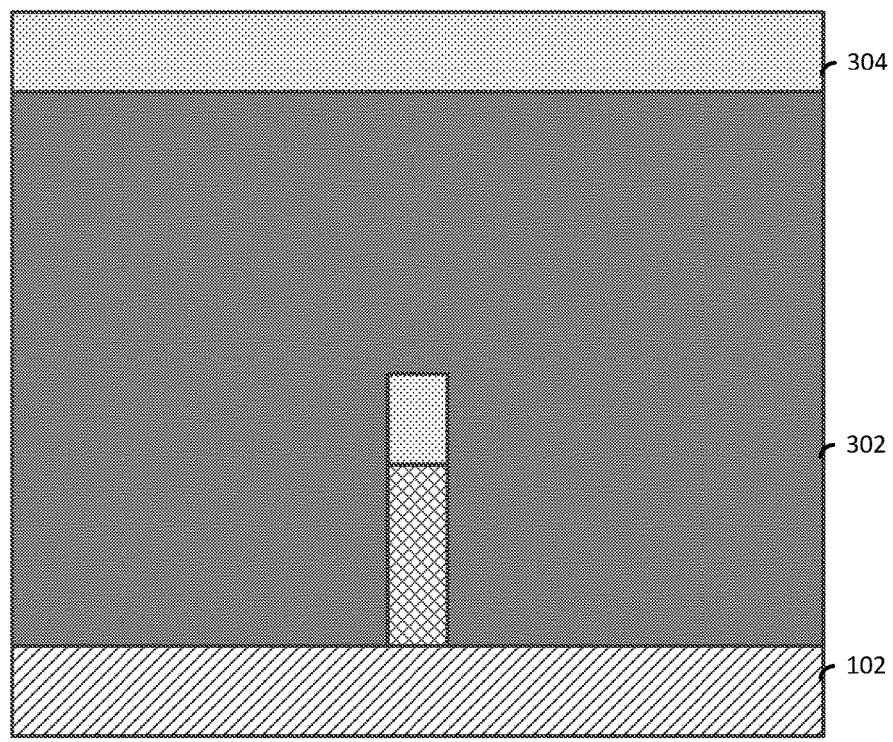
FIG. 3A illustrates a cut-away view along the line A-A (of FIG. 3B) following the formation of sacrificial gates.

FIG. 3A illustrates a cut-away view along the line A-A (of FIG. 3B) following the formation of sacrificial gates 302. The sacrificial gates 302 in the exemplary embodiment are formed by depositing a layer (not shown) of sacrificial gate material such as, for example, amorphous silicon (aSi), or polycrystalline silicon (polysilicon) material or another suitable sacrificial gate material. The sacrificial gate 302 may further comprises a sacrificial gate dielectric material such as silicon oxide between the nanowires and aSi or polysilicon material.

The layer sacrificial gate material may be deposited by a deposition process, including, but not limited to, physical vapor deposition (PVD), chemical vapor deposition (CVD), atomic layer deposition (ALD, plasma enhanced chemical vapor deposition (PECVD), inductively coupled plasma chemical vapor deposition (ICP CVD), or any combination thereof.

Following the deposition of the layer of sacrificial gate material, a hard mask layer (not shown) such as, for example, silicon oxide, silicon nitride (SiN), SiOCN, SiBCN or any suitable combination of those materials, is deposited on the layer of sacrificial gate material to form a PC hard mask or sacrificial gate cap 304. The hardmask layer may be deposited using a deposition process, including, but not limited to, PVD, CVD, PECVD, or any combination thereof.

Figure 3B:
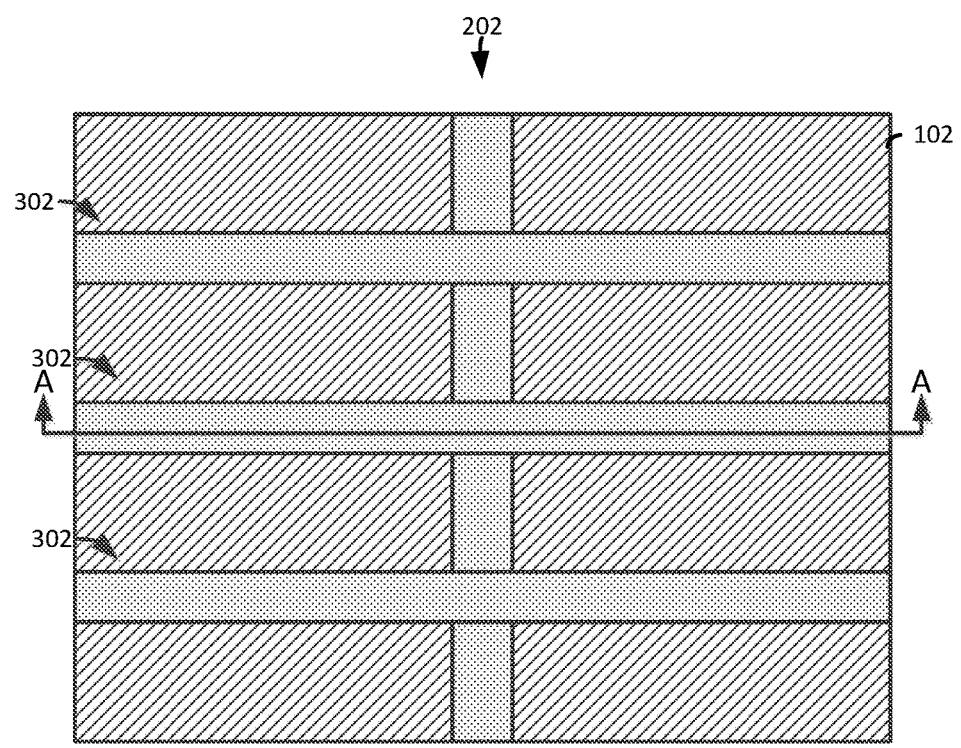
FIG. 3B illustrates a top view of the sacrificial gates arranged over the fins.

Following the deposition of the layer sacrificial gate material and the hardmask layer, a lithographic patterning and etching process such as, for example, reactive ion etching or a wet etching process is performed to remove exposed portions of the hardmask layer and the layer of sacrificial gate material form the sacrificial gates 302 and the sacrificial gate caps 304. FIG. 3B illustrates a top view of the sacrificial gates 302 arranged over the fins 202.

Figure 4:
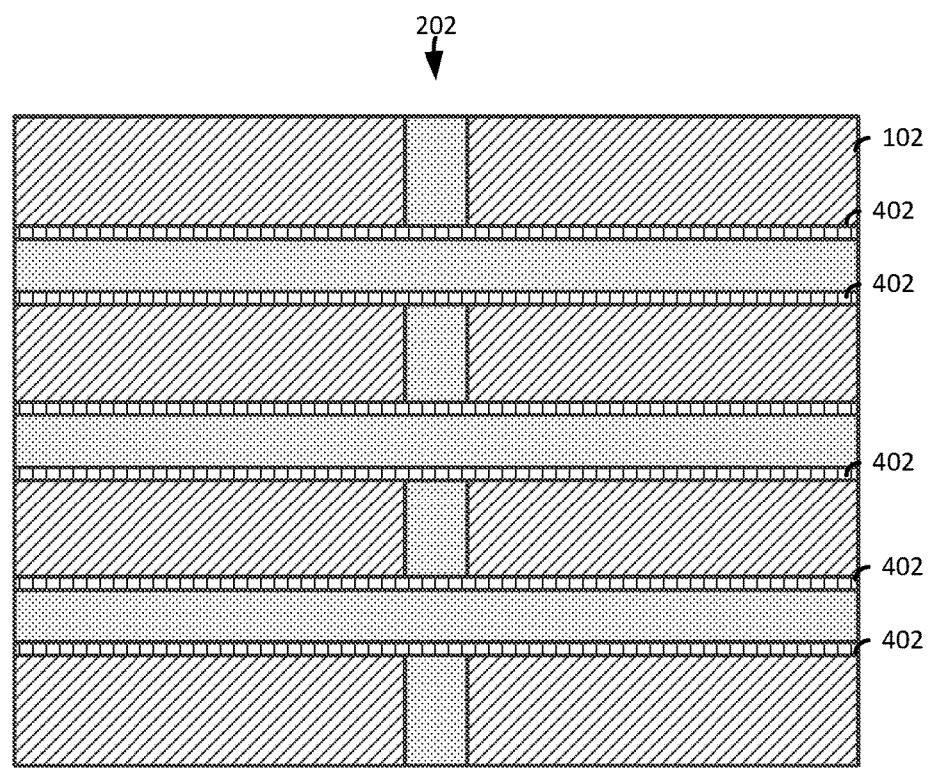

FIG. 4 illustrates a top view following the formation of spacers 402 along sidewalls of the sacrificial gates 302. The spacers 402 in the illustrated embodiment are formed by depositing a layer of spacer material (not shown) over the exposed portions of the substrate 101, the fins 202, and the sacrificial gates 302. Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

Following the deposition of the layer of spacer material, a suitable anisotropic etching process such as, for example, a reactive ion etching process is performed to remove portions of the layer of spacer material and form the spacers 402.

Figure 5:
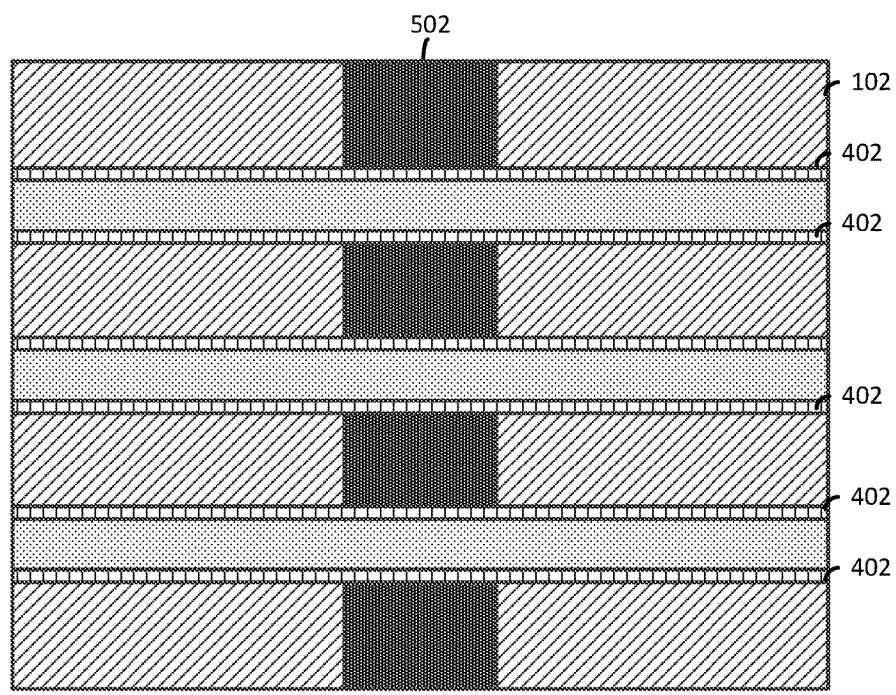

FIG. 5 illustrates a top view following the formation of source/drain regions 502. The source/drain regions 502 are formed by an epitaxial growth process that deposits a crystalline overlayer of semiconductor material onto the exposed crystalline seed material of the exposed fin 202 to form the source/drain regions 502.

Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1 \times 10^{19}$ cm$^{-3}$ to $2 \times 10^{21}$ cm$^{-3}$, or preferably between $2 \times 10^{20}$ cm$^{-3}$ to $1 \times 10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon may be used.

Figure 6A:
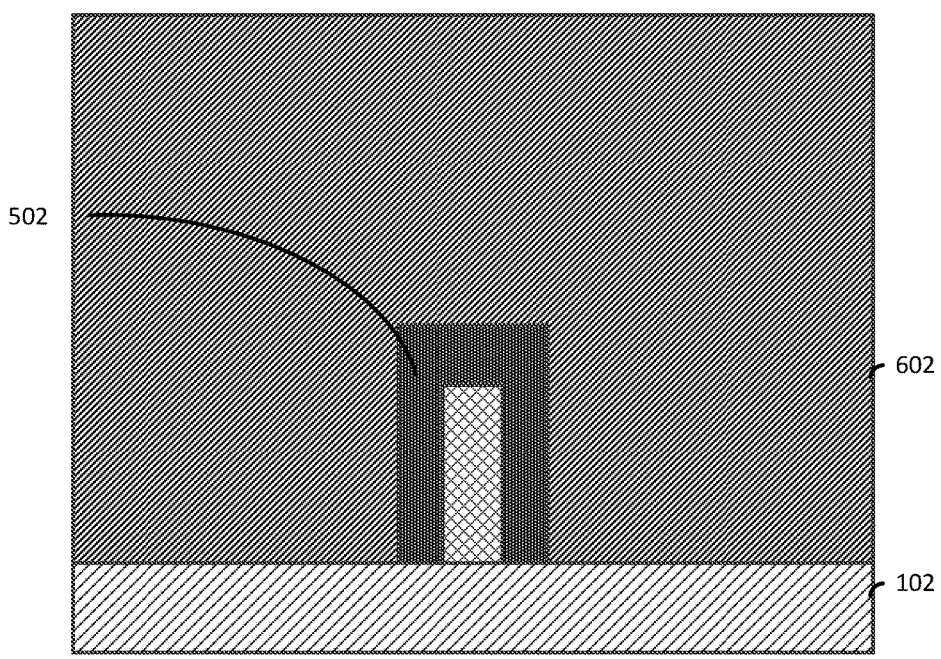
FIG. 6A illustrates a cut-away view along the line B-B (of FIG. 6B) following the deposition of an insulator layer over exposed portions of the substrate and the source/drain regions.
Figure 6B:
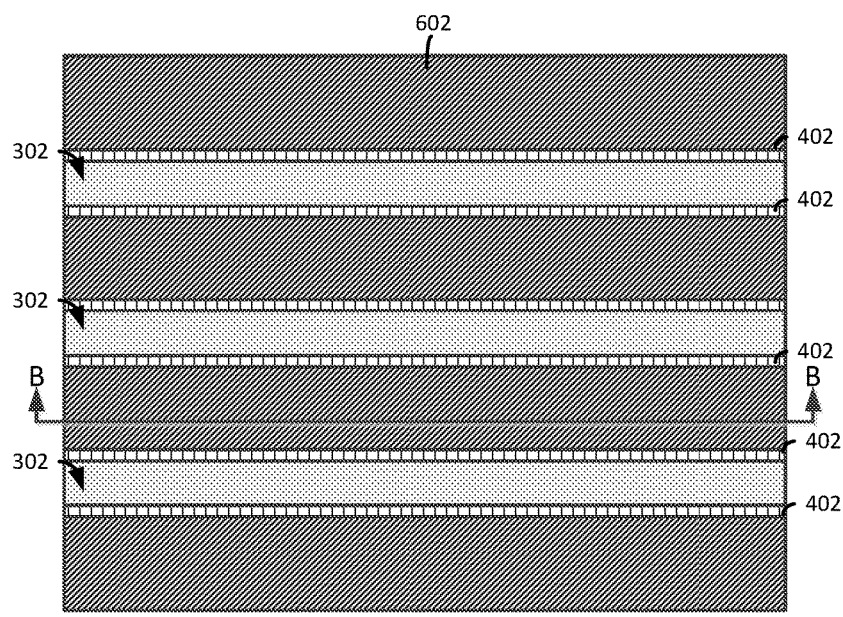
FIG. 6B illustrates a top view following the deposition of the insulator layer.

FIG. 6A illustrates a cut-away view along the line B-B (of FIG. 6B) following the deposition of an insulator layer 602 over exposed portions of the substrate 102 and the source/drain regions 502 (of FIG. 6B). In the illustrated exemplary embodiment, the insulator layer 602 includes a nitride material. In alternate exemplary embodiments, the insulator layer 602 may include portions comprising an oxide material. FIG. 6B illustrates a top view following the deposition of the insulator layer 602.

Figure 7:
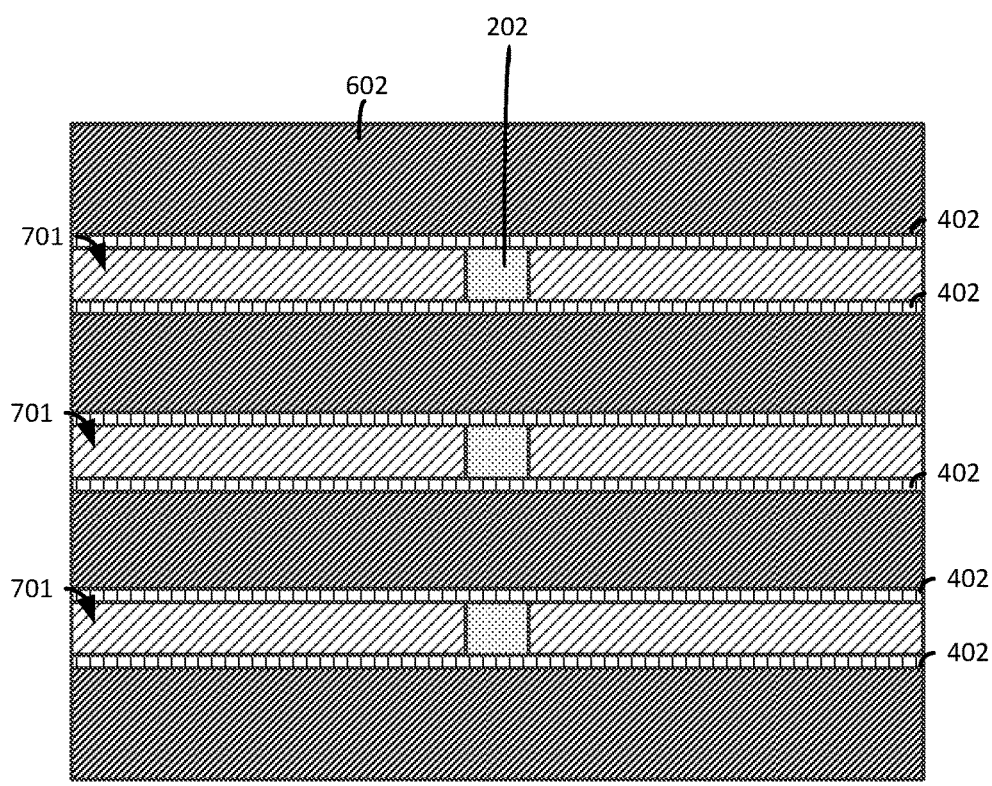

FIG. 7 illustrates a top view following the removal of the sacrificial gates 302 (of FIG. 6B) to form cavities 701 that expose the channel regions of the fins 202. The sacrificial gates 302 may be removed by performing a dry etch process, for example, ME, followed by a wet etch process. The wet etch process is selective to (will not substantially etch) the spacers 402 and the inter-level dielectric material. The chemical etch process may include, but is not limited to, hot ammonia or tetramethylammonium hydroxide (TMAH).

Figure 8A:
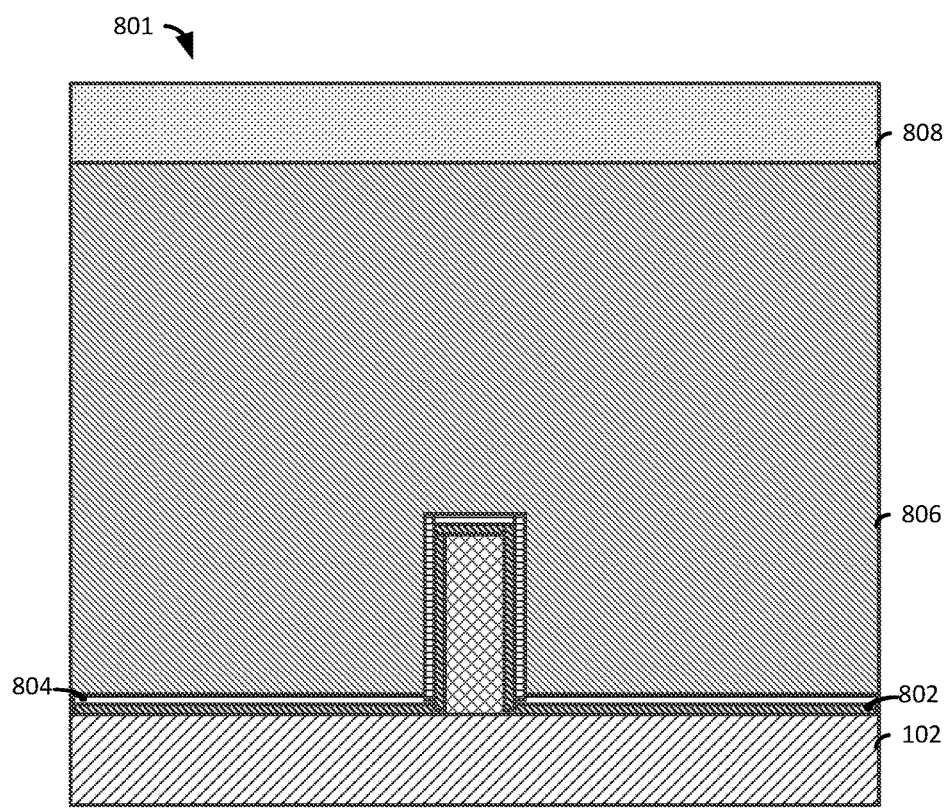
FIG. 8A illustrates a cut-away view along the line A-A (of FIG. 8C) of the resultant structure following the formation of a replacement metal gate stack.

FIG. 8A illustrates a cut-away view along the line A-A (of FIG. 8C) of the resultant structure following the formation of a replacement metal gate stack (gate stack) 801. The gate stack 801 include high-k metal gates formed, for example, by filling the cavity 701 (of FIG. 7) with one or more gate dielectric 802 materials, one or more work function metals 804, and one or more metal gate conductor 806 materials. A gate cap 808 is formed on the metal gate conductor 806 material. The gate dielectric 802 material(s) can be a dielectric material having a dielectric constant greater than 3.9, 7.0, or 10.0. Non-limiting examples of suitable materials for the dielectric 802 materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric 802 materials may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of high-k dielectric materials used. The dielectric material layer may have a thickness in a range from about 0.5 to about 20 nm.

The work function metal(s) 804 may be disposed over the gate dielectric 802 material. The type of work function metal(s) 804 depends on the type of transistor and may differ between the nFET and pFET devices. Non-limiting examples of suitable work function metals 804 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

The gate conductor 806 material(s) is deposited over the gate dielectric 802 materials and work function metal(s) 804 to form the gate stack 801. Non-limiting examples of suitable conductive metals include aluminum (Al), platinum (Pt), gold (Au), tungsten (W), titanium (Ti), or any combination thereof. The gate conductor 806 material(s) may be deposited by a suitable deposition process, for example, CVD, PECVD, PVD, plating, thermal or e-beam evaporation, and sputtering.

Following the deposition of the gate dielectric 802 materials, the work function metal(s) 804, and the gate conductor 806 material(s), planarization process, for example, chemical mechanical planarization (CMP), is performed to remove the overburden of the deposited gate materials and form the gate stack 801.

Figure 8B:
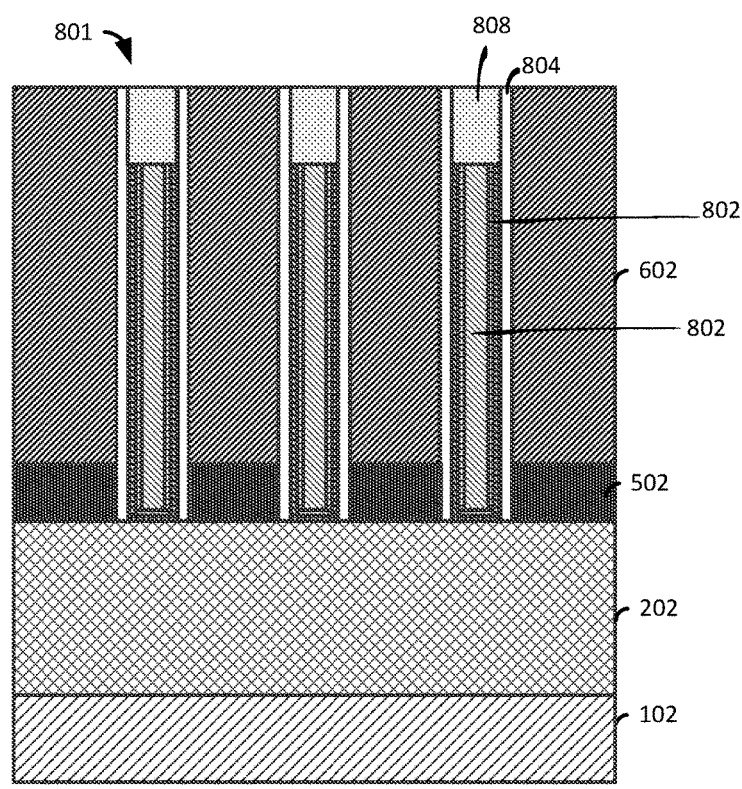
FIG. 8B illustrates a cut-away view along the line C-C (of FIG. 8C) following the formation of the replacement metal gate stacks.
Figure 8C:
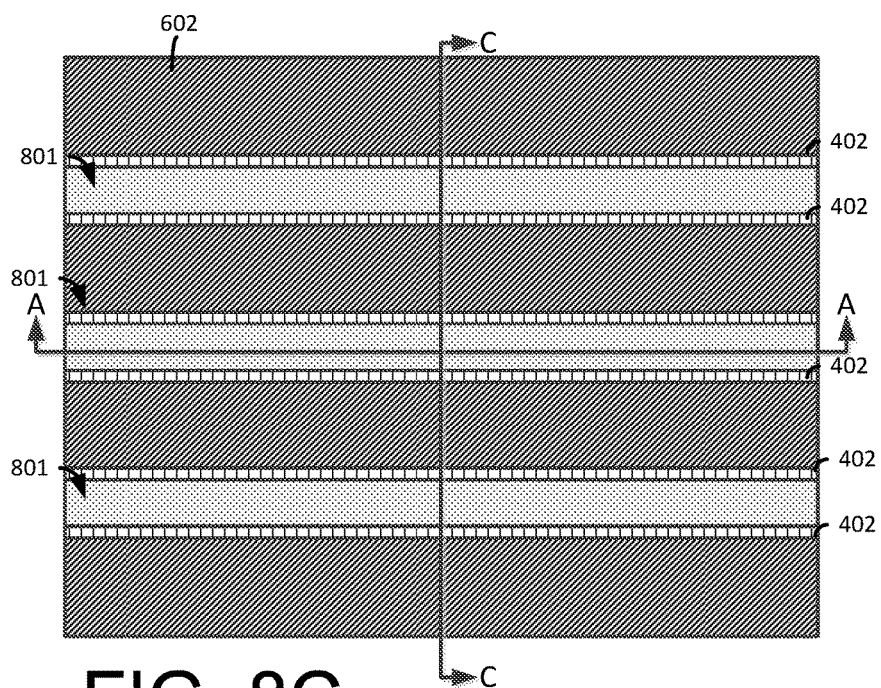
FIG. 8C illustrates a top view following the formation of the replacement metal gate stacks.

FIG. 8B illustrates a cut-away view along the line C-C (of FIG. 8C) and FIG. 8C illustrates a top view following the formation of the replacement metal gate stacks 801.

Figure 9A:
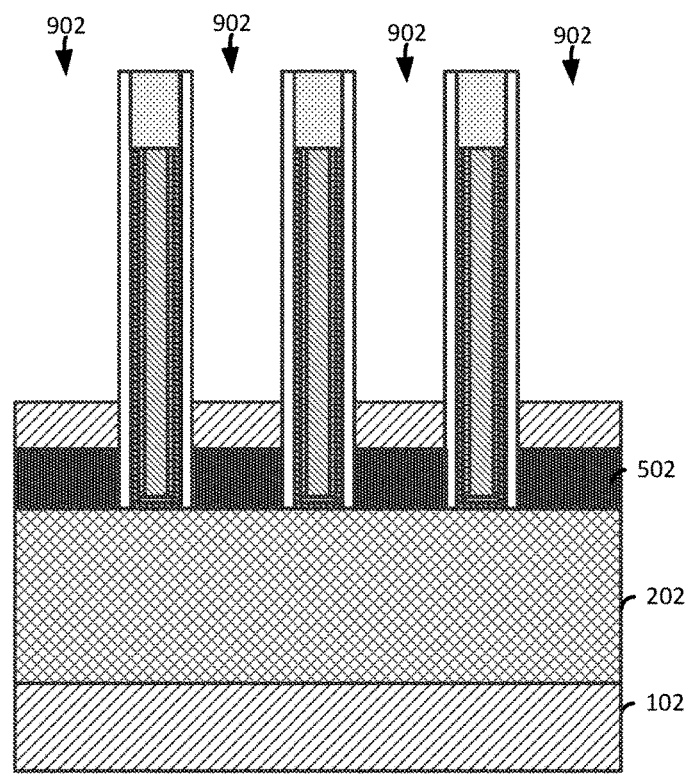
FIG. 9A illustrates a cut-away view along the line C-C (of FIG. 9B) following the formation of cavities in the insulator layer.
Figure 9B:
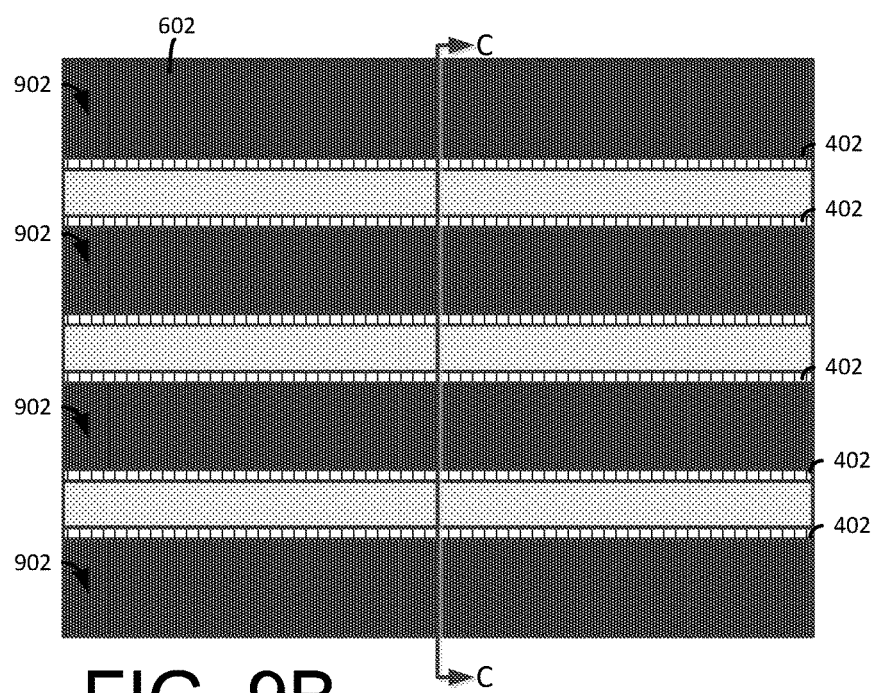
FIG. 9B illustrates a top view following the formation of the cavities.
Figure 9C:
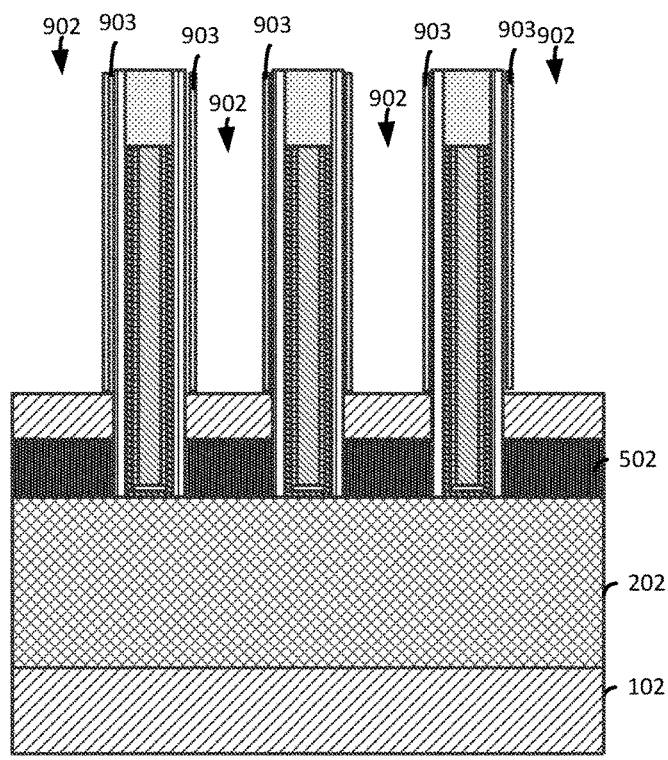
FIG. 9C illustrates a cut-away view along the line C-C (of FIG. 9B) after depositing a liner layer in the cavities prior to the deposition of a conductive material.

FIG. 9A illustrates a cut-away view along the line C-C (of FIG. 9B) following the formation of cavities 902 in the insulator layer 602. The cavities 902 are formed by, for example, an etching process such as reactive ion etching that selectively removes portions of the insulating layer 602 to expose portions of the source/drain regions 502. FIG. 9B illustrates a top view following the formation of the cavities 902.

Figure 10:
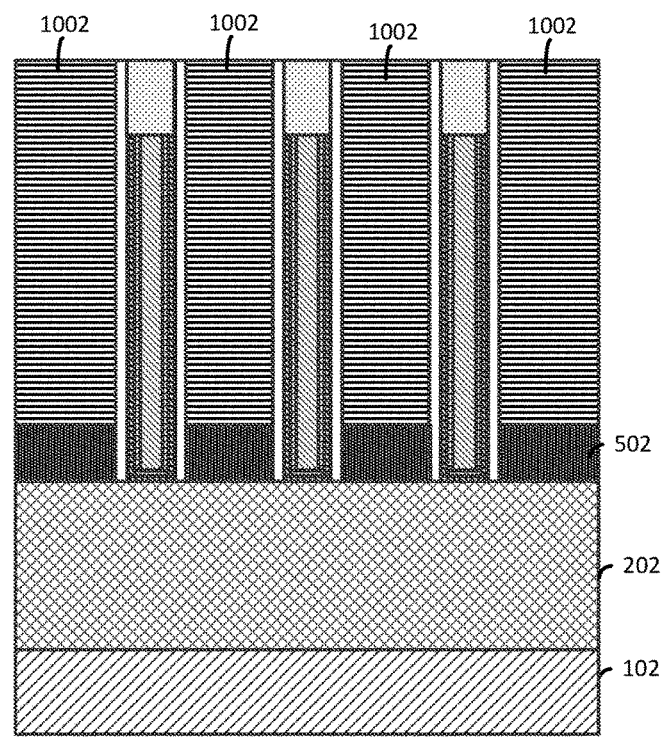

FIG. 10 illustrates a cut-away view following the deposition of conductive material 1002 in the cavities 902 (of FIG. 9A). The cavities 902 may be filled by a conductive material 1002 and, in some embodiments, a liner layer 903 (see FIG. 9C) may be deposited in the cavities 902 prior to the deposition of the conductive material 1002. Following the deposition of the conductive material 1002, a planarization process such as, for example, chemical mechanical polishing may be performed to remove overburdened conductive material. In some exemplary embodiments, a silicide (not shown) may be formed on the source/drain regions 502 prior to the deposition of the conductive material 1002. Silicides may include, for example, Ni silicide, NiPt silicide, or Ti silicide.

Figure 11:
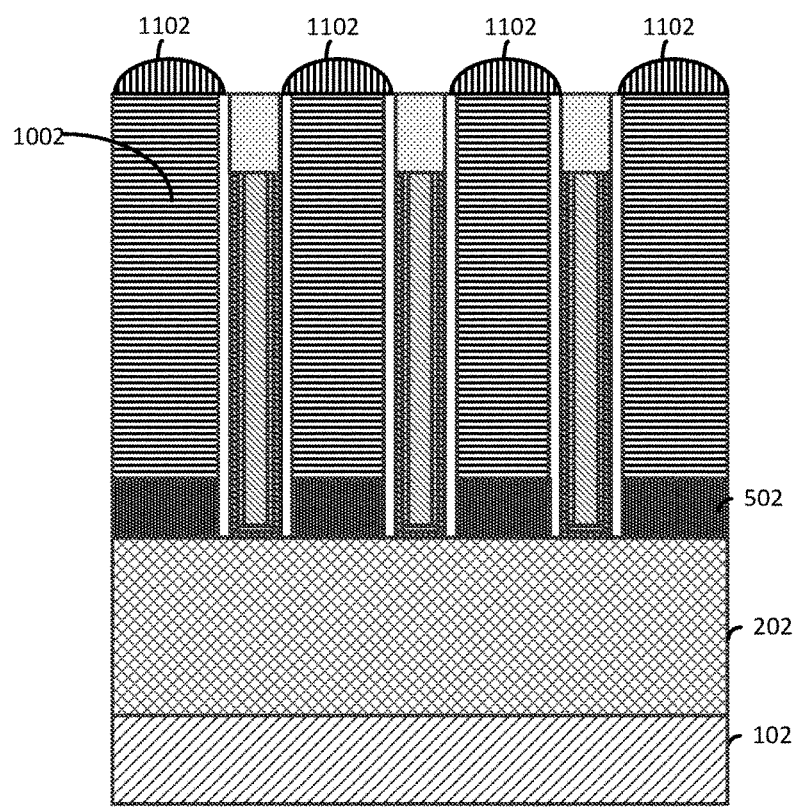

FIG. 11 illustrates a cut-away view following the growth of a second conductive material 1102 on exposed portions of the conductive material 1002. The second conductive material 1102 forms conductive extension regions that are arranged on the conductive material 1002 and portions of the insulator layer 602. The growth of the second conductive material 1102 may be performed by, for example, an electroless deposition (ELD) process.

Figure 12:
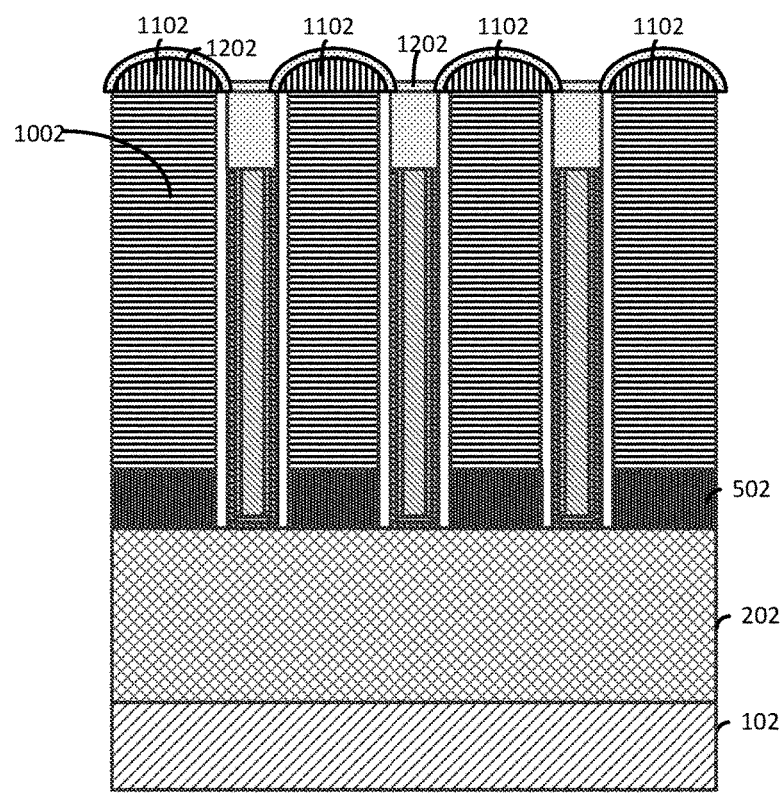

FIG. 12 illustrates a cut-away view following the deposition of a protective layer 1202 over exposed portions of the conductive material 1102, the gate stack and the insulator layer 602. The protective layer 1202 in the illustrated exemplary embodiment includes, for example, a nitride material or SiBCN. The protective layer 1202 is operative to reduce or substantially prevent the undesirable oxidation of the second conductive material 1002.

Figure 13:
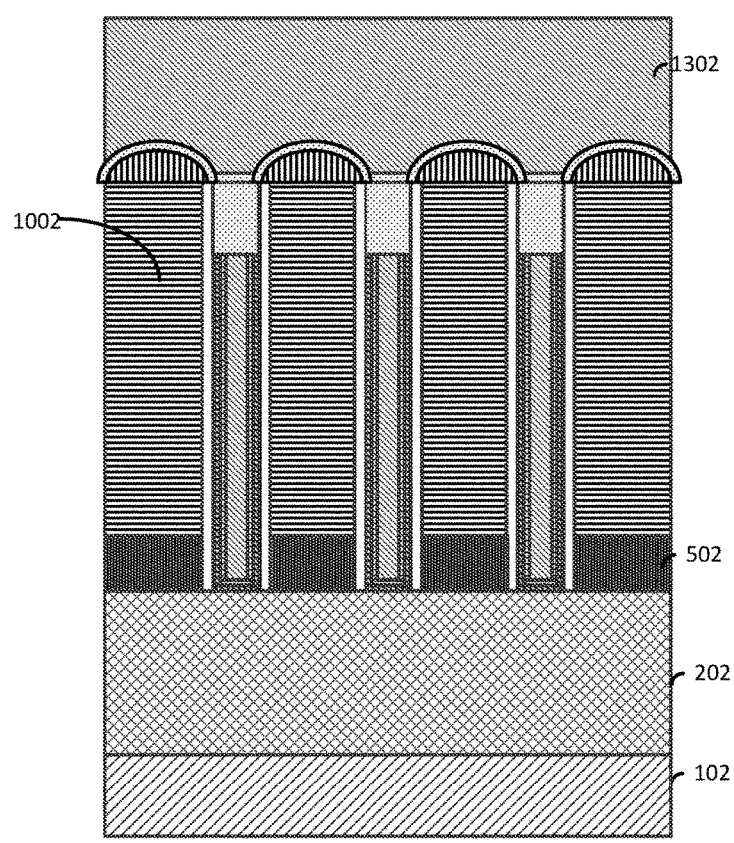

FIG. 13 illustrates a cut-away view following the deposition of an inter-level dielectric layer 1302 over the protective layer 1202. The inter-level dielectric layer 1302 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 1302 is deposited by a deposition process, including, but not limited to CVD, PVD, plasma enhanced CVD, atomic layer deposition (ALD), evaporation, chemical solution deposition, or like processes. Following the deposition of the inter-level dielectric layer 1302, a planarization process such as, for example, chemical mechanical polishing is performed.

Figure 14:
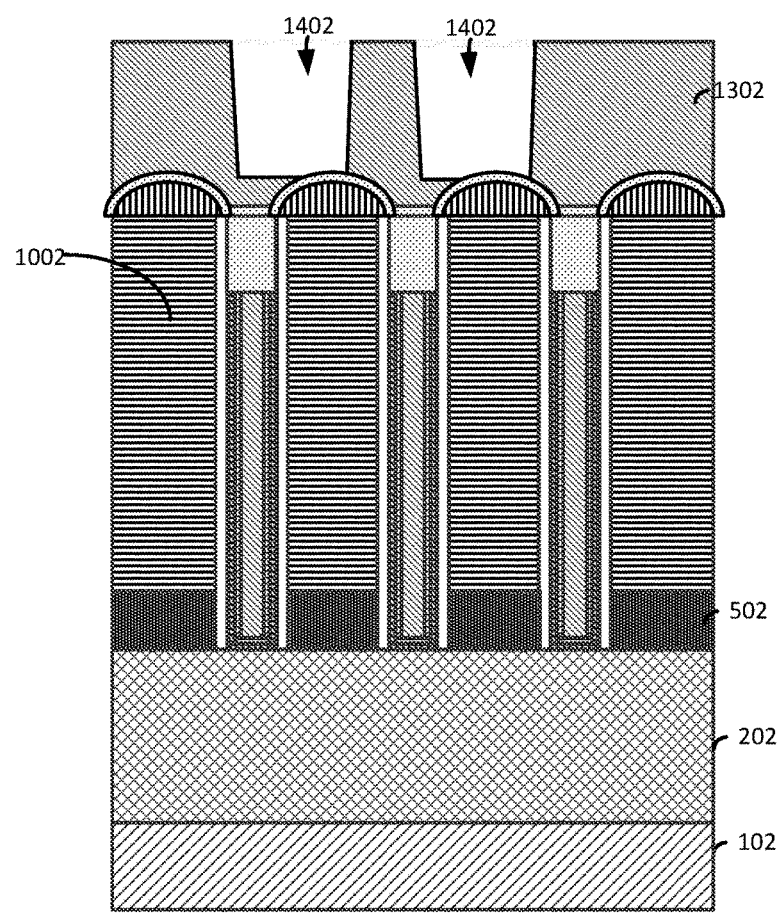

FIG. 14 illustrates a cut-away view following a lithographic patterning and etching process that removes exposed portions of the inter-level dielectric layer 1302 to form cavities 1402 that expose portions of the protective layer 1202. The cavities may be formed by, for example, a reactive ion etching process that selectively removes material of the inter-level dielectric layer 1302 and exposes the protective layer 1202.

Figure 15A:
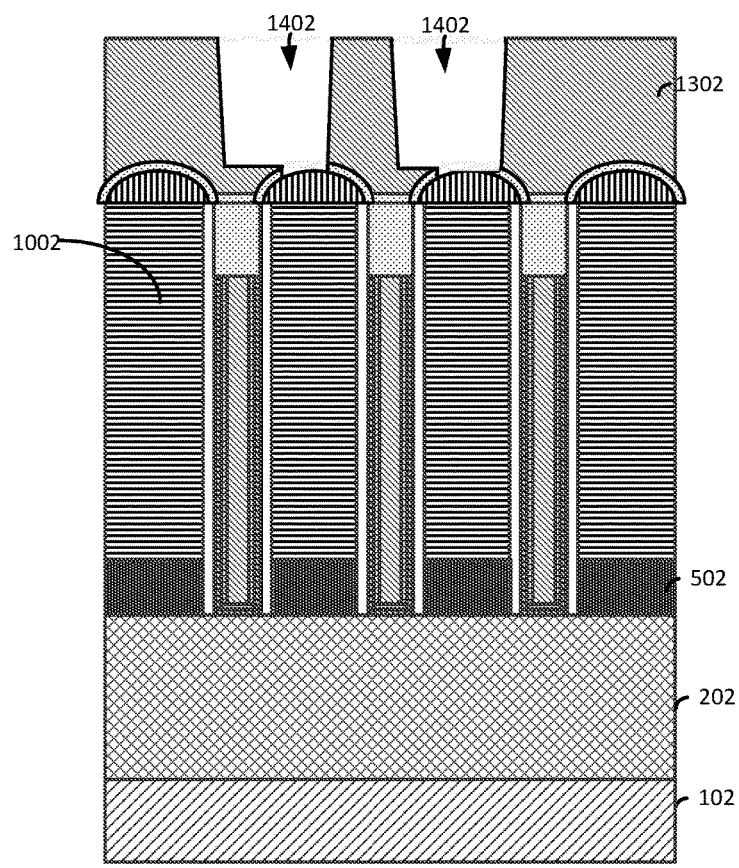
FIG. 15A illustrates a cut-away view following another selective etching process that increases the depth of the cavities.
Figure 15B:
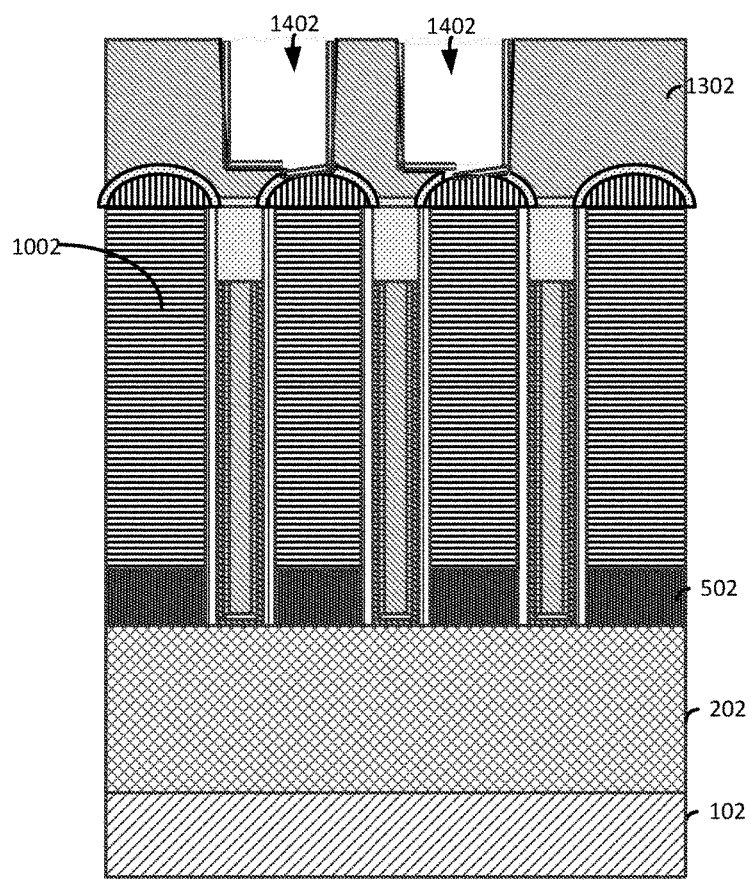
FIG. 15B illustrates a cut-away view after depositing a liner layer prior to depositing the third conductive material.

FIG. 15A illustrates a cut-away view following another selective etching process that increases the depth of the cavities 1402 by selectively removing the exposed portions of the protective layer 1202 and exposes portions of the second conductive material 1102.

Figure 16A:
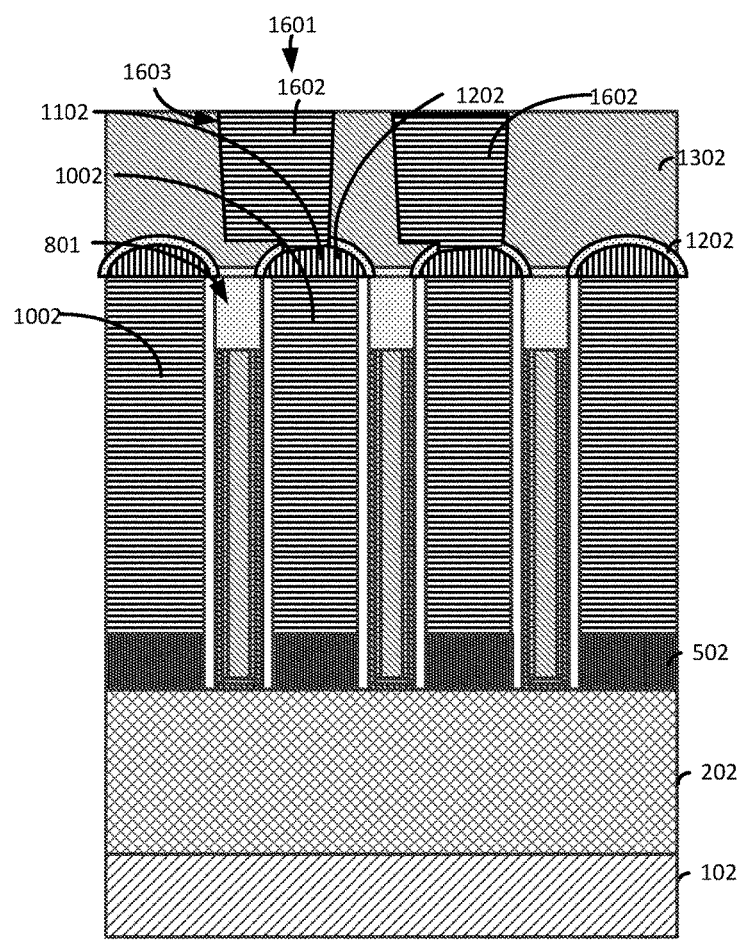
FIG. 16A illustrates a cut-away view along the line C-C (of FIG. 16B) following the deposition of a third conductive material that fills the cavities.
Figure 16B:
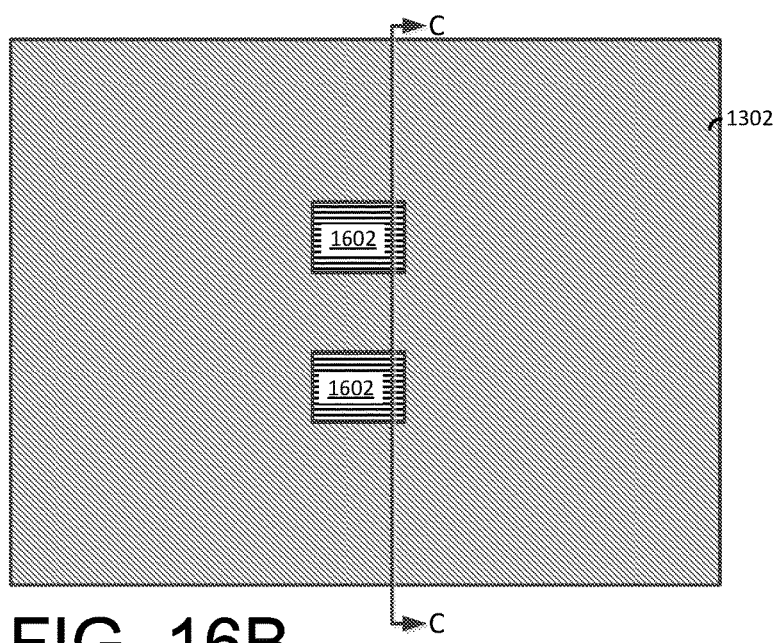

FIG. 16A illustrates a cut-away view along the line C-C (of FIG. 16B) following the deposition of a third conductive material 1602 that fills the cavities 1402 with a conductive material. The cavities 1402 may be lined with a liner layer 1403 (see FIG. 15B) prior to depositing the third conductive material 1602. FIG. 16B illustrates a top view of the third conductive material 1602 and the inter-level dielectric layer 1302.

FIG. 16A illustrates a cut-away view along the line C-C (of FIG. 16B) following the deposition of a third conductive material 1602 that fills the cavities 1402 with a conductive material. The cavities 1402 may be lined with a liner layer (not shown) prior to depositing the third conductive material 1602. FIG. 16B illustrates a top view of the third conductive material 1602 and the inter-level dielectric layer 1302.

Referring to FIG. 16A, the resultant contact 1601 includes the conductive material 1002, the conductive material (extension region) 1102, and the third conductive material 1602, that electrically contact the source/drain region 502.

The extension region 1102 provides a relatively larger surface area as opposed to the conductive material 1002 to pattern and form the third conductive material 1602. The extension region 1102 extends over the gate stacks 801 and/or the spacers. The relatively larger surface area of the extension region 1102 allows for a greater margin of error for aligning the pattern used to form the third conductive contact material 1602. In this regard, the sidewall 1603 is arranged over the gate stack 801.

Though this arrangement may not be ideal from a design perspective, the arrangement often occurs when there is a misalignment of the lithographic pattern used to pattern the cavities 1402 (of FIG. 14). The extension region 1102 provides additional surface area laterally and vertically for the protective layer 1202 to be exposed when the cavities 1402 are formed without exposing the gate stack. This forms a connection between the contacts 1002 and the conductive contact material 1602 while avoiding forming a short between the gate stacks 801 and the conductive material 1602.

As used herein, the terms "invention" or "present invention" are non-limiting terms and not intended to refer to any single aspect of the particular invention but encompass all possible aspects as described in the specification and the claims. The term "on" may refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a semiconductor device, the method comprising:
forming a plurality of gate stacks on a channel region of a semiconductor substrate, the gate stacks including sidewalls extending from a gate stack upper surface to a gate stack base that contacts the channel region, and including gate spacers formed on the sidewalls;
forming a plurality of source/drain regions on the semiconductor substrate and adjacent to the channel region such that each gate stack among the plurality of gate stacks is separated by one another by at least one of the source/drain regions;
depositing a first insulator layer over the source/drain region;
removing a portion of the first insulator layer to form a first cavity that exposes a portion of the source/drain region;
depositing a first conductive material in the first cavity, the first conductive material including conductive sidewalls extending from a conductive base that contacts the source/drain region to a conductive upper surface, the conductive upper surface being flush with the gate stack upper surface, wherein the first conductive material is formed flush with and directly contacts at least one sidewall spacer;
forming a conductive extension from the first conductive material over the first insulator layer and over the gate spacers;
depositing a protective layer over the conductive extension and directly on the gate stack upper surface, the protective layer comprising a first dielectric material;
depositing a second insulator layer over the protective layer, the second insulator layer comprising a second dielectric material different from the first dielectric material;
removing a portion of the second insulator layer while preserving the protective layer to form a second cavity that exposes the protective layer;
removing an exposed portion of the protective layer while preserving a remaining portion of the second insulator layer to expose a portion of the conductive extension; and depositing a second conductive material in the second cavity while a remaining portion of the protective layer prevents conductive contact between the second conductive material and the gate stack.

2. The method of claim 1, wherein the first insulator layer includes a nitride material.

3. The method of claim 1, wherein the first insulator layer includes an oxide material.

4. The method of claim 1, wherein the protective layer includes a nitride material.

5. The method of claim 1, wherein the second insulator layer includes an oxide material.

6. The method of claim 1, wherein the conductive extension is formed from a third conductive material.

7. The method of claim 1, wherein the conductive extension is arranged over the first conductive layer and contacts the first insulator layer.

8. The method of claim 1, wherein prior to depositing the first conductive material in the first cavity, a liner layer is deposited in the first cavity.

9. The method of claim 1, wherein prior to depositing the second conductive material in the second cavity, a liner layer is deposited in the second cavity.

10. The method of claim 1, wherein removing the first protective layer includes maintain a portion of the protective layer that directly contacts the gate stack upper surface.

11. The method of claim 10, wherein the protective layer is deposited after forming a metal gate conductor of the gate stack.

12. A method for forming a semiconductor device, the method comprising:
    forming a semiconductor fin on a substrate;
    forming a plurality of gate stacks over a channel region of the semiconductor fin, the gate stacks including sidewalls extending from a gate stack upper surface to a gate stack base that contacts the channel region, and including gate spacers formed on the sidewalls;
    forming a plurality of source/drain region on the semiconductor fin such that each gate stack among the plurality of gate stacks is separated by one another by at least one of the source/drain regions;
    depositing a first insulator layer over the source/drain region;
    removing a portion of the first insulator layer to form a first cavity that exposes a portion of the source/drain region;
    depositing a first conductive material in the first cavity, the first conductive material including conductive sidewalls extending from a conductive base that contacts the source/drain region to a conductive upper surface, the conductive upper surface being flush with the gate stack upper surface, wherein the first conductive material is formed flush with and directly contacts at least one sidewall spacer;
    forming a conductive extension from the first conductive material over the first insulator layer and over the gate spacers;
    depositing a protective layer over the conductive extension and directly on the gate stack, the protective layer comprising a first dielectric material;
    depositing a second insulator layer over the protective layer, the second insulator layer comprising a second dielectric material different from the first dielectric material;
    removing a portion of the second insulator layer while preserving the protective layer to form a second cavity that exposes the protective layer;
    removing an exposed portion of the protective layer while preserving a remaining portion of the second insulator layer to expose a portion of the conductive extension; and
    depositing a second conductive material in the second cavity while a remaining portion of the protective layer prevents conductive contact between the second conductive material and the gate stack.

13. The method of claim 12, wherein the first insulator layer includes a nitride material.

14. The method of claim 12, wherein the first insulator layer includes an oxide material.

15. The method of claim 12, wherein the protective layer includes a nitride material.

16. The method of claim 12, wherein the second insulator layer includes an oxide material.

17. The method of claim 12, wherein the conductive extension is formed from a third conductive material.

18. The method of claim 12, wherein the conductive extension is arranged over the first conductive layer and contacts the first insulator layer.

19. The method of claim 12, wherein prior to depositing the first conductive material in the first cavity, a liner layer is deposited in the first cavity.

20. The method of claim 12, wherein prior to depositing the second conductive material in the second cavity, a liner layer is deposited in the second cavity.

* * * * *